United States Patent
Lee et al.

(10) Patent No.: US 7,142,570 B2
(45) Date of Patent: Nov. 28, 2006

(54) APPARATUS AND METHOD FOR GENERATING OPTICAL CARRIER FOR MICROWAVE AND MILLIMETERWAVE PHOTONICS SYSTEM

(75) Inventors: Sang-Soo Lee, Daejon (KR); Heuk Park, Daejon (KR); Hyunwoo Cho, Seoul (KR); Sang-Kyu Lim, Daejon (KR); Je-Soo Ko, Daejon (KR)

(73) Assignee: Electronics and Telecommunications Research Institute (KR)

( * ) Notice: Subject to any disclaimer, the term of this patent is extended or adjusted under 35 U.S.C. 154(b) by 275 days.

(21) Appl. No.: 10/880,766

(22) Filed: Jun. 28, 2004

(65) Prior Publication Data

US 2005/0141582 A1    Jun. 30, 2005

(30) Foreign Application Priority Data

Dec. 26, 2003   (KR) .................... 10-2003-0097913

(51) Int. Cl.
G02F 1/35 (2006.01)
G01S 2/02 (2006.01)
H01S 3/00 (2006.01)
H01S 3/10 (2006.01)
H01S 3/092 (2006.01)

(52) U.S. Cl. ............... 372/21; 372/28; 372/38.06; 372/70; 359/326; 359/334; 356/484

(58) Field of Classification Search ............ 372/6, 372/21, 23, 25, 26, 28, 38.06, 70; 359/326, 359/334; 356/484
See application file for complete search history.

(56) References Cited

U.S. PATENT DOCUMENTS

| | | | | |
|---|---|---|---|---|
| 4,159,178 A | * | 6/1979 | Vali et al. ................. 356/461 |
| 4,778,238 A | * | 10/1988 | Hicks ........................ 398/92 |
| 4,840,456 A | * | 6/1989 | Fye ........................... 359/566 |
| 5,170,457 A | * | 12/1992 | Jen ........................... 385/123 |
| 5,379,309 A | * | 1/1995 | Logan, Jr. .................. 372/18 |
| 5,383,207 A | * | 1/1995 | Culverhouse et al. ..... 372/28 |
| 5,515,192 A | * | 5/1996 | Watanabe .................. 398/198 |
| 5,723,856 A | * | 3/1998 | Yao et al. ............ 250/227.11 |
| H1791 H | * | 3/1999 | Williams .................. 385/140 |
| 5,917,179 A | * | 6/1999 | Yao ..................... 250/227.11 |
| 6,907,052 B1 | * | 6/2005 | Kozlowski et al. ... 372/29.011 |

FOREIGN PATENT DOCUMENTS

JP      11-271827      10/1999

OTHER PUBLICATIONS

"Optical Generation of Millimeter-Wave Signals for Fiber-Radio Systems Using a Dual-Mode DFB Semiconductor Laser", D. Wake, et al, 1995 IEEE, p. 2270-2276.

* cited by examiner

Primary Examiner—Minsun Oh Harvey
Assistant Examiner—Hrayr Sayadian
(74) Attorney, Agent, or Firm—Blakely Sokoloff Taylor & Zafman

(57) ABSTRACT

An apparatus and a method for generating an optical carrier is disclosed. The apparatus includes: a light source generating a pump light; a SBS generator for stimulated Brillouin scattering the pump light to generate a stokes light from the light source; an attenuator for controlling an amplitude of the pump light from the light source to generate an amplitude controlled pump light; and a detector for heterodyne beating the stokes light and the amplitude controlled pump light to generate an optical carrier.

9 Claims, 5 Drawing Sheets

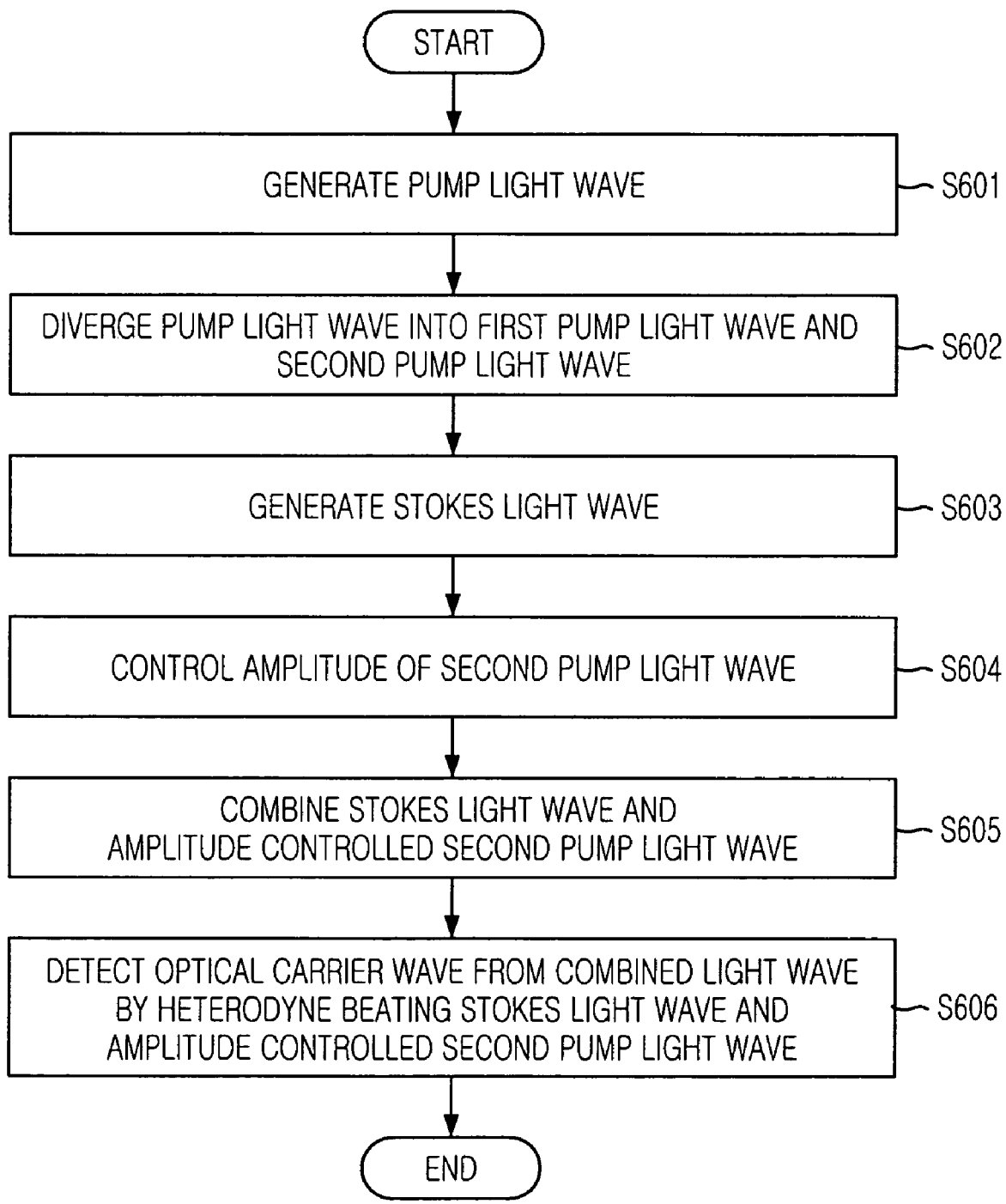

APPARATUS AND METHOD FOR GENERATING OPTICAL CARRIER FOR MICROWAVE AND MILLIMETERWAVE PHOTONICS SYSTEM

FIELD OF THE INVENTION

The present invention relates to an apparatus and a method for generating an optical carrier; and, more particularly, to an apparatus and a method for generating an optical carrier by heterodyne-beating a pump light wave and a stokes light wave for a microwave and millimeterwave photonics system.

DESCRIPTION OF RELATED ARTS

Generally, a millimeter wave and a microwave carrier are generated by heterodyne-beating two independent light waves having a predetermined frequency difference, which is a desired frequency of a carrier. A heterodyne-beating is a method for generating the carrier having a predetermined frequency by heterodyne beating or combining two light waves having a frequency difference, wherein the frequency of the carrier is determined by the frequency difference between two light waves.

An effective method for generating micro or millimeter carrier is one of major techniques for directly converting a radio frequency signal into an optical signal and transmitting the optical signal.

There have been various techniques introduced for generating an optical carrier such as a direct optical carrier generation method, an in-direct optical carrier generation method and a heterodyne beating method.

The direct optical carrier generation method generates an optical carrier by directly applying radio frequency (RF) signal into a semiconductor laser diode. It is cost effective method but there are limitations about a speed of generating the carrier and a linearity of the carrier. Therefore, the direct optical carrier generation method is used for generating an optical carrier having less than 2 GHz frequency band.

The in-direct optical carrier generation method generates an optical carrier by using a $LiNbO_3$ interference type optical carrier generation unit or an electro-absorption optical carrier generation unit. The above mentioned optical carrier generation units are very expensive because of expensive materials used for generating interference and absorption an optical wave.

The heterodyne beating method generates the optical carrier by beating or combining two light waves having difference frequencies.

FIG. 1 is a conventional apparatus for generating an optical carrier by using a heterodyne beating method.

As shown, the conventional apparatus 100 includes a first laser diode 101A, a second laser diode 101B, a first frequency regulator 102A, a second frequency regulator 102B and an optical detector 103.

The conventional-apparatus 100 generates two difference light waves having a predetermined frequency difference by using the first laser diode 101A and the second laser diode 101B. Each of two light waves is respectively passed through the first frequency regulator 102A and the second frequency regulator 102B for stabilizing frequencies of the light waves. The optical detector 103 detects an optical carrier by heterodyne beating two light waves having the predetermined frequency difference. The heterodyne beating method is simple and cost-effective method for generating the optical carrier.

The above mentioned heterodyne beating method is also disclosed in U.S. Pat. No. 4,840,456 issued by Donald M, Fye, Wayland, Mass., at Jun. 20, 1989, entitled "METHODS OF AND APPARATUS FOR GENERATION OF RADIO FREQUENCY SIGNALS". In the U.S. Pat. No. 4,840,456, the optical carrier is generated by using an external resonator having two reflectors and an optical distributor for generating two light waves having a predetermined frequency difference and combining the two light waves. However, frequencies of two light waves may vary by external impact or long period of operation.

Furthermore, another heterodyne beating method is introduced in U.S. Pat. No. 5,379,309 issued by Ronald T. Logan, Jr., S. Pasadena, at Jan. 3, 1995, entitled "HIGH FREQUENCY SOURCE HAVING HETERODYNED LASER OSCILLATORS INJECTION-LOCKED TO A MODE-LOCKED LASER". In the U.S. Pat. No. 5,379,309, the optical carrier is generated by selecting light waves having desired frequency difference among light waves generated from a mode-locked laser diode and performing an injection locking operation by using a master laser diode. However, there are also problems of additional requiring a mode-locked laser diode and a filter having narrow bandwidth.

SUMMARY OF THE INVENTION

It is, therefore, one object of the present invention to provide an apparatus and a method for generating an optical carrier by heterodyne-beating a pump light wave having an optical power density higher than the SBS threshold value from a laser diode and a stokes light wave generated from a stimulated Brillouin scattering generator by using the pump light wave for a microwave photonics system.

It is another object of the present invention to provide an apparatus and a method for generating an optical carrier by heterodyne-beating a pump light wave and stokes light wave without using additional device such as a frequency regulator, a mode-locked laser and an insertion-locked laser.

In accordance with one aspect of the present invention, there is provided an apparatus for generating an optical carrier for a microwave photonics system, the apparatus including: a light source generating a pump light; a SBS generator for stimulated Brillouin scattering the pump light to generate a stokes light from the light source; an attenuator for controlling an amplitude of the pump light from the light source to generate an amplitude controlled pump light; and a detector for heterodyne beating the stokes light and the amplitude controlled pump light to generate an optical carrier.

In accordance with another aspect of the present invention, there is also provided an apparatus for generating an optical carrier for a microwave photonics system, the apparatus including: a light source generating a pump light; a coupler for splitting the pump light into a first pump light and a second pump light; a SBS generator for stimulated Brillouin scattering the first pump light to generate a stokes light from the splitting means; an attenuator for controlling an amplitude of the first pump light from the splitting means to generate an amplitude controlled second pump light; and a detector for heterodyne beating the stokes light and the amplitude controlled second pump light to generate an optical carrier.

In accordance with still another aspect of the present invention, there is also provided a method for generating an optical carrier for a microwave photonics system, the method including the steps of: a) generating a pump light having an optical density higher than a predetermined SBS threshold value at a light source; b) stimulated Brillouin scattering the pump light for generating a stokes light at a stimulated Brillouin scattering generator; c) controlling an amplitude of the pump light wave passed through the stimulated Brillouin scattering generator to generate an amplitude controlled pump light at an optical attenuator; d) changing a propagation direction of the amplitude controlled pump light wave to the stimulated Brillouin scattering generator; e) passing the stokes light and the amplitude controlled pump light at an optical circulator; and f) generating an optical carrier by heterodyne beating the stokes light and the amplitude controlled pump light.

In accordance with further still another aspect of the present invention, there is also provided a method for generating an optical carrier for a microwave photonics system, the method including the steps of: a) generating a pump light having an optical density higher than a predetermined SBS threshold value; b) splitting the pump light into a first pump light and a second pump light; c) generating a stokes light by using the first pump light; d) controlling an amplitude of the second pump light; e) combining the stokes light and the amplitude controlled second pump light; and f) detecting an optical carrier from the combined light by heterodyne beating the combined light.

BRIEF DESCRIPTION OF THE DRAWINGS

The above and other objects and features of the present invention will become better understood with regard to the following description of the preferred embodiments given in conjunction with the accompanying drawings, in which:

FIG. 6 is a flowchart of a method for generating an optical carrier in accordance with another preferred embodiment of the present invention.

DETAILED DESCRIPTION OF THE INVENTION

Hereinafter, an apparatus and a method for generating an optical carrier by heterodyne-beating a pump light wave and a stokes light wave for a microwave photonics system in accordance with a preferred embodiment of the present invention will be described in detail with reference to the accompanying drawings.

For helping to understand the present invention, a stimulated Brillouin scattering (SBS) is explained hereinafter.

The SBS is a phenomenon of scattering a light wave cause by an interaction between a light wave entered into an optical fiber, which is a stimulated Brillouin scattering generator, and thermal vibration generated by collision of the light wave and molecules of the optical fiber. When the light wave is scattered, a negative phonon characteristic is additional generated and a frequency of scattered light wave is reduced from a frequency of the entered light wave as much as a frequency of negative phonon characteristic. The above mentioned frequency variation may be different according to an angle of scattering and a direction of scattered light wave is opposite from a direction of the entered light wave.

The SBS is generated when an optical density of the entered light wave, such as pump light wave or pump optical beam, is higher than a predetermined threshold value. The predetermined threshold value is defined by following equation when a light wave entered stimulated brillouin scattering generator (an optical fiber) is not maintained as a polarized light state.

$$\text{threshold}(P_B) = 4.4 s 10^{-3} d^2 \lambda^2 \alpha_{dB} v \qquad \text{Eq. 1}$$

In Eq. 1, a unit of $P_B$ is a Watt (W), d is a diameter of an optical core, $\lambda$ is a wavelength with a unit of μm. $\alpha_{dB}$ is a optical fiber loss with a unit of dB/Km and v is a bandwidth of optical source with a unit of GHz.

Figure 1:
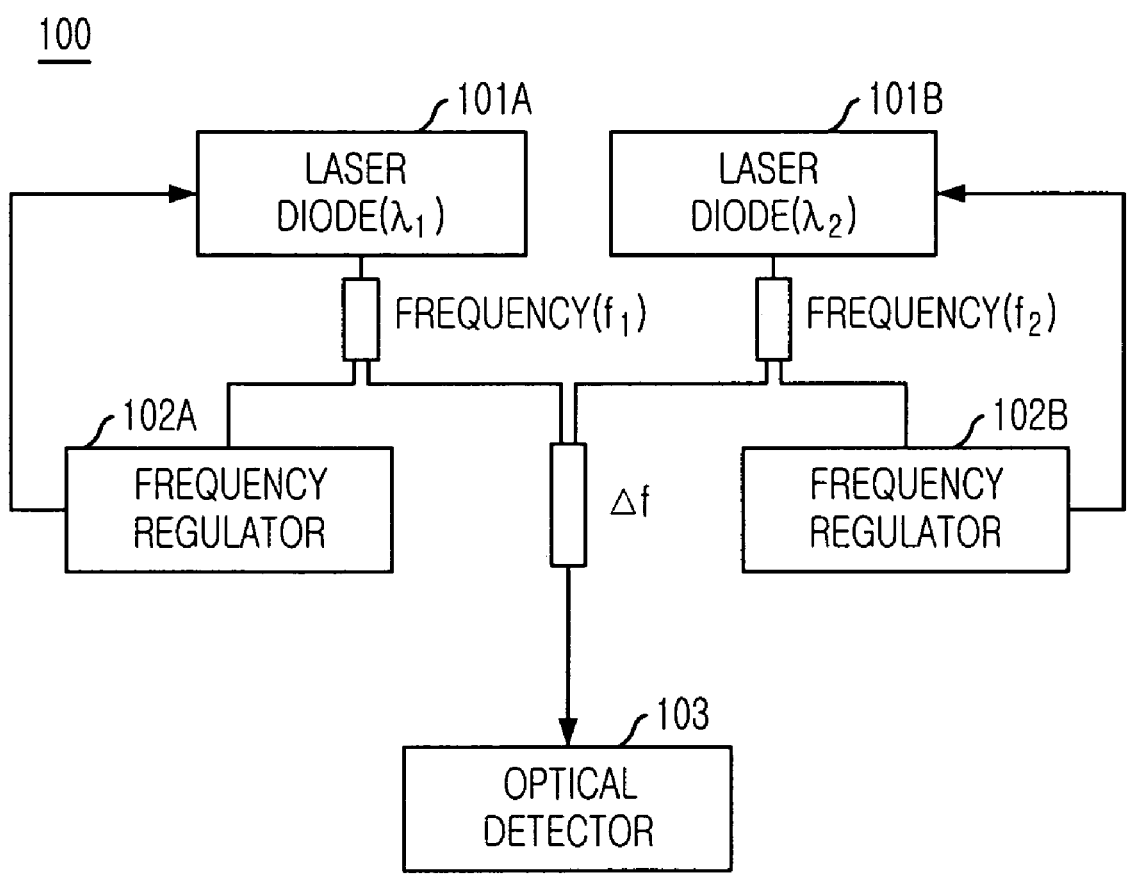
FIG. 1 is a conventional apparatus for generating an optical carrier by using a heterodyne beating method.
Figure 2:
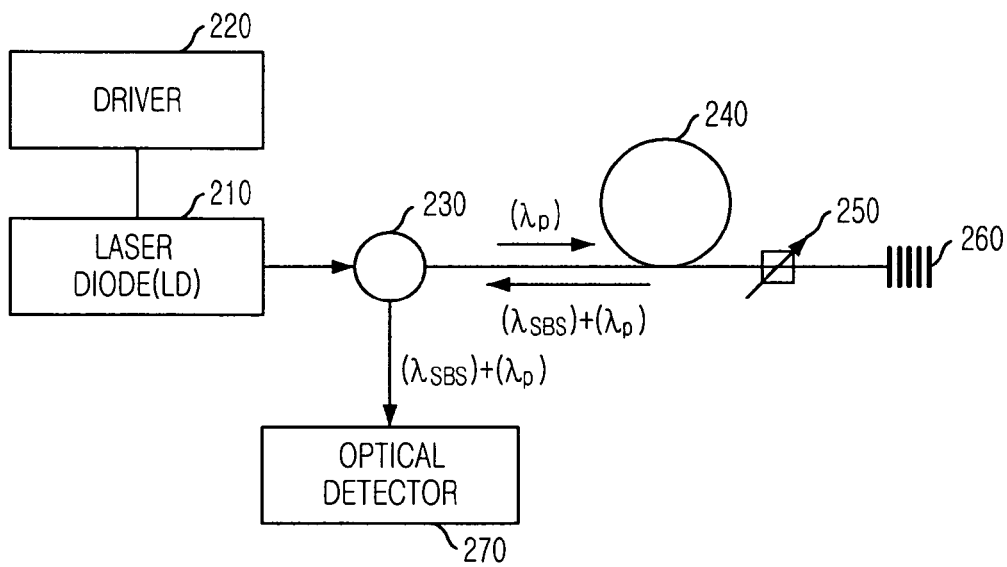
FIG. 2 is diagram illustrating an apparatus for generating an optical carrier for a microwave photonic system in accordance with a preferred embodiment of the present invention.

FIG. 2 is diagram illustrating an apparatus for generating an optical carrier for a microwave photonic system in accordance with a preferred embodiment of the present invention.

As shown in FIG. 2, the apparatus 200 includes a laser diode 210, a driver 220, an optical circulator 230, a stimulated Brillouin scattering (SBS) generator 240, an attenuator 250, an optical fiber reflection grating 260 and an optical detector 270

The laser diode 210 generates a pump light wave ($\lambda_p$) having an optical power density higher than a predetermined threshold, which can generate a stimulated Brillouin scattering (SBS).

The driver 220 controls operation of the laser diode 210.

The optical circulator 230 passes the pump light wave ($\lambda_p$) to the stimulated Brillouin scattering (SBS) generator 240 and passes an amplitude controlled pump light wave ($\lambda_p$) and a stokes light wave ($\lambda_{SBS}$) from the SBS generator 240 to the optical detector 270.

The stimulated Brillouin scattering (SBS) generator 240 generates the stokes light wave ($\lambda_{SBS}$) by stimulated Brillouin scattering the pump light wave ($\lambda_p$) from the laser diode 210. A propagation direction of the stokes light wave is opposite from the propagation direction of the pump light wave. That is, the stokes light wave is propagated to the optical circulator 230.

The attenuator 250 controls an amplitude of the pump light wave ($\lambda_p$) which is passed through the SBS generator 240.

The optical fiber reflection grating 260 reflects the amplitude controlled pump light wave ($\lambda_p$) from the attenuator 250 to the SBS generator 240.

The optical detector 270 detects an optical carrier by heterodyne beating the amplitude controlled pump light wave ($\lambda_p$) and the stokes light wave ($\lambda_{SBS}$) from the optical circulator 230.

The predetermined threshold value for the pump light wave is approximately 10 dBm to 13 dBm for generating the stokes light wave at the SBS generator 240. For example, the SBS generator 240 generates the stokes light wave having a wavelength of 1550.08 nm when the pump light wave having a wavelength of 1550 nm enters into the SBS generator.

The wavelength of the stokes light wave generated from the SBS generator 240 may differ according to a type of an optical fiber of the SBS generator 240 and a frequency of the stokes light wave is minutely controlled by changing external environment factors, e.g., changing a temperature of the optical fiber of the SBS generator 240 or applying external perturbation. It is possible because a phonon characteristic in a wave region of an optical fiber generating the stimulated Brillouin scattering is changed according to the external environment factors. That is, the phonon characteristic of the SBS generator is changed according to the external environment factors.

The optical circulator 230 has a first, a second and a third ports for receiving and passing the pump light wave, the amplitude controlled pump light wave and the stokes light wave.

The first port receives the pump light wave from the laser diode 210.

The second port outputs the pump light wave from the laser diode 210 to the SBS generator 240 and receives the amplitude controlled pump light wave and the stokes light wave from the SBS generator 240.

The third port outputs the amplitude controlled pump light wave and the stokes light wave from the SBS generator 240 to the optical detector 270.

The optical detector 270 generates the optical carrier by heterodyne beating the stokes light wave and the amplitude controlled pump light wave and output the optical carrier to a modulator (not shown) for inserting information into the optical carrier and transmitting the optical carrier with the information.

Figure 3:
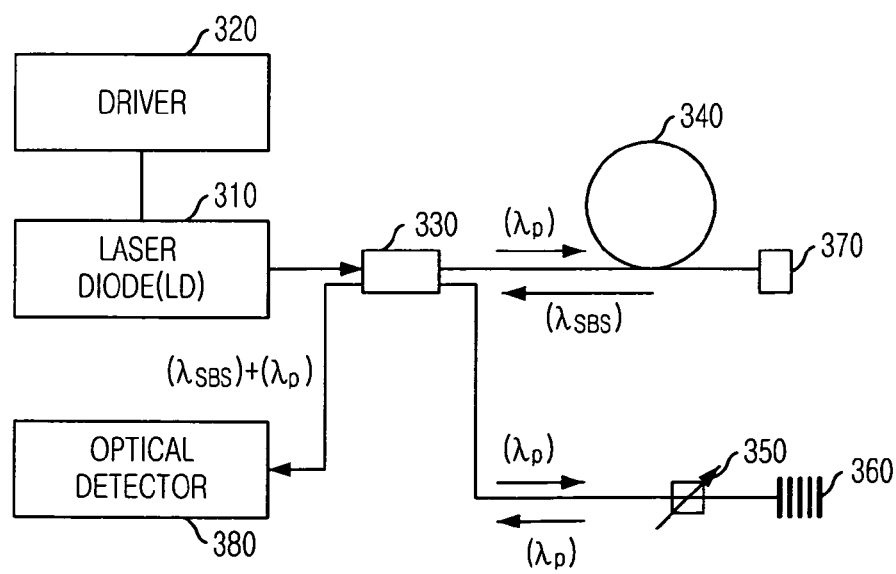
FIG. 3 is a diagram illustrating an apparatus for generating an optical carrier of a microwave photonic system in accordance with another preferred embodiment of the present invention.

FIG. 3 is a diagram illustrating an apparatus for generating an optical carrier of a microwave photonic system in accordance with another preferred embodiment of the present invention.

As shown in FIG. 3, the apparatus 300 includes a laser diode 310, a driver 320, a coupler 330, a stimulated Brillouin scattering (SBS) generator 340, an optical attenuator 350, an optical fiber reflection grating 360, an optical terminator 370 and an optical detector 380.

The laser diode 310 generates a pump light wave $\lambda_p$ having an optical power density higher than a predetermined threshold value for a stimulated Brillouin scattering.

The driver 320 controls the laser diode 320 to generates the pump light wave.

The coupler 330 splits the pump light wave into a first pump light wave and a second pump light wave, passes the first pump light wave to the SBS generator 340 and passes the second pump light wave to an optical attenuator 350, and passes a stokes light wave ($\lambda_{SBS}$) from the SBS generator 340 and an amplitude controlled second pump light wave from the optical attenuator 350 to the optical detector 380.

The SBS generator 340 generates the stokes light wave by stimulated Brillouin scattering the first pump light wave from the coupler 330.

The attenuator 350 controls an amplitude of the second pump light wave from the coupler 330 to generate the amplitude controlled second pump light wave.

The optical fiber reflection grating 360 reflects the amplitude controlled second pump light wave to the coupler 330 through the optical attenuator 350.

The optical terminator 370 eliminates the first pump light wave passed through the SBS generator 340.

The optical detector 380 heterodyne beats the amplitude controlled second pump light wave and the stokes light wave from the coupler 330 to generate an optical carrier.

In the apparatus for generating the optical carrier of the present invention, various frequency generators and filters such as Brillouin/Erbium Fiber Laser (BEFL) can be used instead of using the SBS generator for generating optical carriers having various frequencies. The frequency generator is a device generating light waves of various frequency bands. By using the frequency generator, various frequency bands of optical carriers can be generated by filtering two optical waves having a desired frequency difference and heterodyne-beating two optical waves.

Furthermore, the present invention can be implemented with a radio over fiver technology directly converting a radio frequency signal into an optical wave for effectively modulating the radio frequency signal.

Figure 4:
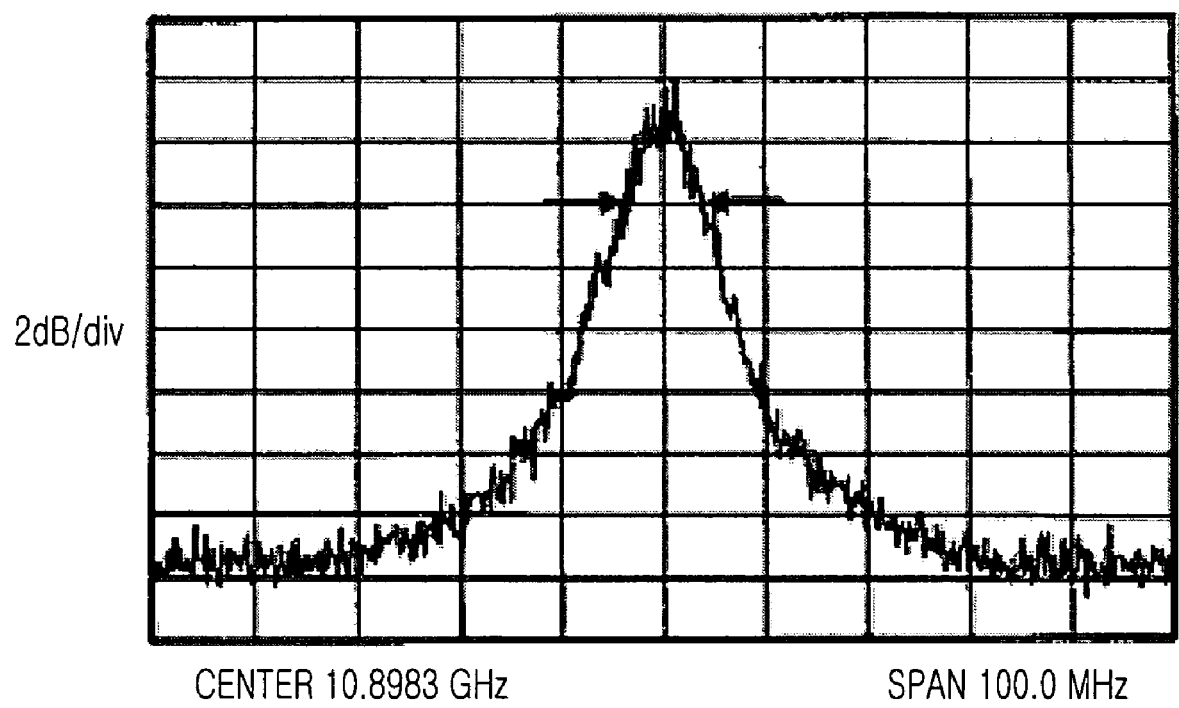
FIG. 4 is a graph showing a RF spectrum of an optical carrier in accordance with a preferred embodiment of the present invention.

FIG. 4 is a graph showing a RF spectrum of an optical carrier in accordance with a preferred embodiment of the present invention.

As shown, the graph shows that the optical carrier generated from the preferred embodiment of the present invention has a center frequency spectrum as approximately 10.8983 GHz and a range of frequency spectrum as approximately 100.0 MHz.

Figure 5:
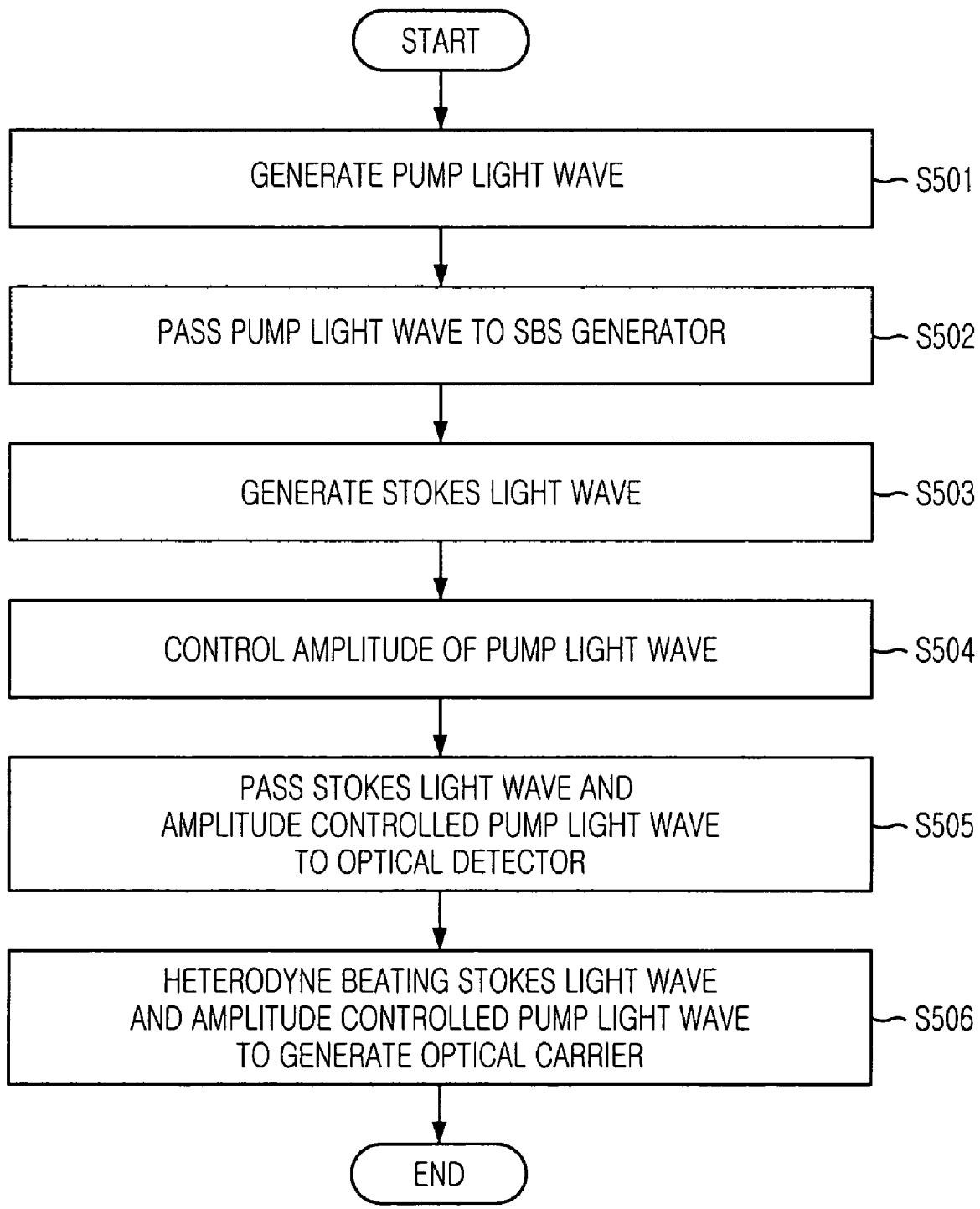
FIG. 5 is a flowchart of a method for generating an optical carrier in accordance with a preferred embodiment of the present invention.

FIG. 5 is a flowchart of a method for generating an optical carrier in accordance with a preferred embodiment of the present invention.

As shown, at step S501, a laser diode generates a pump light wave having an optical density higher than a predetermined threshold value for generating a stimulated Brillouin scattering (SBS) at a stimulated Brillouin scattering (SBS) generator and transmits the pump light wave to an optical circulator.

The optical circulator receives the pump light wave from the laser diode and passes the pump light wave to the SBS generator at step S502.

The SBS generator generates a stokes light wave by stimulated Brillouin scattering the pump light wave at step S503. A propagation direction of the strokes light wave is opposite direction of a propagation direction of the pump light wave. That is, the stokes light wave is propagated to the optical circulator.

An optical attenuator controls an amplitude of the pump light wave passed through the SBS generator to generate an amplitude controlled pump light wave and the amplitude controlled pump light wave is reflected by an optical fiber reflection grating for changing a propagation direction of the amplitude controlled pump light wave at step S504. That is, the amplitude controlled pump light wave is propagated to the SBS generator.

The optical circulator receives the strokes light wave from the SBS generator and the amplitude controlled pump light wave from the optical fiber reflection grating and passes the strokes light wave and the amplitude controlled pump light wave to an optical detector at step S505.

The optical detector detects an optical carrier from the strokes light wave and the amplitude controlled pump light wave by heterodyne beating the strokes light wave and the amplitude controlled pump light wave at step S506.

FIG. 6 is a flowchart of a method for generating an optical carrier in accordance with another preferred embodiment of the present invention.

As shown, a laser diode generates a pump light wave having an optical density higher than a predetermined threshold value and transmits the pump light wave to a coupler at step S601.

The coupler splits the pump light wave into a first pump light wave and a second pump light wave, passes the first pump light wave to a SBS generator and passes the second pump light wave to an optical attenuator at step S602.

The SBS generator receives the first pump light wave and generates a stokes light wave by stimulated Brillouin scattering the first pump light wave at step S603. A propagation direction of the stokes light wave is opposite from the first pump light wave. Therefore, the stokes light wave is propagated to the coupler.

At step S604, the optical attenuator controls amplitude of the second pump light wave and passes the amplitude controlled second pump light wave to an optical fiber reflection grating. The optical fiber reflection grating reflects the amplitude controlled second pump light wave to the optical attenuator by changing the propagation direction of the amplitude controlled second pump light wave.

The coupler combines the strokes light wave from the SBS generator and the amplitude controlled second pump light wave and passes the combined light wave to an optical detector at step S605.

The optical detector detects an optical carrier from the combined light wave by heterodyne beating combined light wave at step S606.

As mentioned above, the present invention can effectively generate the optical carrier.

The present invention can effectively generate an optical carrier by heterodyne beating a pump light wave and a stokes light wave generated, which are generated from one laser diode.

Furthermore, the present invention can effective generate an optical micro/millimeter carrier of without using a frequency regulator, an insertion locked laser or a mode locked laser.

Moreover, the present invention can be implemented with a frequency generator such as a Brillouin/Erbium fiber laser (BEFL) and a filter for generating optical carrier having various frequency bands.

The present application contains subject matter related to Korean patent application No. KR 2003-0097913, filed in the Korean patent office on Dec. 26, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An apparatus for generating an optical carrier for a microwave photonics system, the apparatus comprising: a light source generating a pump light; means for stimulated Brillouin scattering the pump light to generate a stokes light from the light source; an attenuator for controlling an amplitude of the pump light from the light source to generate an amplitude controlled pump light; and means for heterodyne beating the stokes light and the amplitude controlled pump light to generate an optical carrier.

2. The apparatus of the claim 1, further comprising: means for passing the pump light from the light source to the stimulated Brillouin scattering means and passing the stokes light and the amplitude controlled pump light to the heterodyne beating means; and means for reflecting the amplitude controlled pump light from the stimulated Brillouin scattering means to the passing means.

3. The apparatus of the claim 1, wherein the pump light has an optical power density higher than a predetermined SBS threshold value.

4. The apparatus of claim 3, wherein the predetermined threshold value is approximately 10 dBm to approximately 13 dBm.

5. The apparatus of claim 1, wherein the stimulated Brillouin scattering means minutely controls a frequency of the stokes light according to external environment factor such as a temperature.

6. The apparatus of claim 1, wherein the stimulated Brillouin scattering means is an optical fiber.

7. The apparatus of claim 1, wherein the stimulated Brillouin scattering means includes a frequency generator such as a Brillouin/erbium fiber laser (BEFL) and a filter.

8. The apparatus of claim 1, wherein the stimulated Brillouin scattering means includes a frequency generator such as a Brillouin/erbium fiber laser (BEFL) and a filter.

9. A method for generating an optical carrier for a microwave photonics system, the method comprising the steps of: a) generating a pump light having an optical density higher than a predetermined threshold value at a light source; b) stimulated Brillouin scattering the pump light for generating a stokes light at a stimulated brillouin scattering generator; c) controlling an amplitude of the pump light wave passed through the stimulated Brillouin scattering generator to generate an amplitude controlled pump light at an optical attenuator; d) changing a propagation direction of the amplitude controlled pump light wave to the stimulated Brillouin scattering generator; e) passing the stokes light and the amplitude controlled pump light at an optical circulator; and f) generating an optical carrier by heterodyne beating the stokes light and the amplitude controlled pump light.

* * * * *